United States Patent
Tsai et al.

(10) Patent No.: US 8,779,513 B2
(45) Date of Patent: Jul. 15, 2014

(54) NON-PLANAR SEMICONDUCTOR STRUCTURE

(71) Applicant: United Microelectronics Corp., Hsin-Chu (TW)

(72) Inventors: Shih-Hung Tsai, Tainan (TW); Chien-Ting Lin, Hsinchu (TW); Chin-Cheng Chien, Tainan (TW); Chin-Fu Lin, Tainan (TW); Chih-Chien Liu, Taipei (TW); Teng-Chun Tsai, Tainan (TW); Chun-Yuan Wu, Yun-Lin County (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 13/869,037

(22) Filed: Apr. 24, 2013

(65) Prior Publication Data
US 2013/0228836 A1 Sep. 5, 2013

Related U.S. Application Data

(63) Continuation of application No. 13/224,344, filed on Sep. 2, 2011, now Pat. No. 8,441,072.

(51) Int. Cl.
*H01L 27/12* (2006.01)
*H01L 29/78* (2006.01)
*H01L 29/66* (2006.01)

(52) U.S. Cl.
CPC ........ *H01L 29/785* (2013.01); *H01L 29/66795* (2013.01)
USPC .......................................... 257/347; 438/288

(58) Field of Classification Search
USPC .................. 257/347, 353, E27.409; 438/288
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,154,118 B2 * | 12/2006 | Lindert et al. | 257/66 |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon et al. | |
| 7,759,737 B2 | 7/2010 | Cho | |
| 7,923,337 B2 | 4/2011 | Chang | |
| 8,569,812 B2 * | 10/2013 | Chang et al. | 257/288 |
| 2004/0195624 A1 | 10/2004 | Liu | |
| 2005/0051825 A1 | 3/2005 | Fujiwara | |
| 2005/0242395 A1 | 11/2005 | Chen | |
| 2006/0099830 A1 | 5/2006 | Walther | |

(Continued)

*Primary Examiner* — Thao P Le
(74) *Attorney, Agent, or Firm* — Winston Hsu; Scott Margo

(57) ABSTRACT

A non-planar semiconductor structure includes a substrate, at least two fin-shaped structures, at least an isolation structure, and a plurality of epitaxial layers. The fin-shaped structures are located on the substrate. The isolation structure is located between the fin-shaped structures, and the isolation structure has a nitrogen-containing layer. The epitaxial layers respectively cover a part of the fin-shaped structures and are located on the nitrogen-containing layer. A non-planar semiconductor process is also provided for forming the semiconductor structure.

6 Claims, 6 Drawing Sheets

(56) References Cited

U.S. PATENT DOCUMENTS

| | | |
|---|---|---|
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0038679 A1 | 2/2010 | Chan |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2011/0180851 A1 | 7/2011 | Doyle |
| 2011/0193172 A1 | 8/2011 | Juengling |
| 2011/0210393 A1* | 9/2011 | Chen et al. .................... 257/347 |
| 2012/0205719 A1 | 8/2012 | Juengling |
| 2012/0267721 A1* | 10/2012 | Chang et al. .................. 257/401 |
| 2012/0313170 A1 | 12/2012 | Chang |
| 2014/0015021 A1* | 1/2014 | Chang et al. .................. 257/288 |

\* cited by examiner

NON-PLANAR SEMICONDUCTOR STRUCTURE

CROSS REFERENCE TO RELATED APPLICATIONS

This application is a continuation application of and claims the benefit of U.S. patent application Ser. No. 13/224,344, filed Sep. 2, 2011.

BACKGROUND OF THE INVENTION

1. Field of the Invention

The present invention relates generally to a semiconductor structure and fabrication method thereof, and more specifically, to a semiconductor structure and fabrication method thereof, which forms a nitrogen-containing layer on the contact surface of an isolation structure and an epitaxial layer.

2. Description of the Prior Art

With increasing miniaturization of semiconductor devices, various Fin-shaped field effect transistor (FinFET) devices have been developed. The Fin-shaped field effect transistor (FinFET) is advantageous for the following reasons. First, manufacturing processes of Fin-shaped field effect transistor (FinFET) devices can be integrated into traditional logic device processes, and thus are more compatible. In addition, since the three-dimensional structure of the FinFET increases the overlapping area between the gate and the substrate, the channel region is more effectively controlled. This therefore reduces drain-induced barrier lowering (DIBL) effect and short channel effect. Moreover, the channel region is longer for the same gate length. Therefore, current between the source and the drain is increased.

Although the Fin-shaped field effect transistor (FinFET) is advantageous for many reasons, performance still needs to be improved. For instance, the epitaxial layers in the Fin-shaped field effect transistor (FinFET) often cover the fin-shaped structures used as source/drain regions to increase the total volume of the source/drain regions. However, as the epitaxial layers are selectively deposited and cover the surface of the fin-shaped structures, the bottom surfaces of the epitaxial layers make contact with the isolation structure below. The different materials of the epitaxial layers and the isolation structure cause mutual repulsion, resulting in a 54.8 launch angle of the epitaxial layers relative to the isolation structure, such that the epitaxial layers and the isolation structure cannot form a complete connection to each other. As a result, owing to each of these epitaxial layers growing upward with an oblique angle relative to the isolation structure, the total volume of each epitaxial layer is limited. Further, sequentially formed silicide is not easy to attach to the epitaxial layers.

SUMMARY OF THE INVENTION

The present invention provides a semiconductor structure and fabrication method thereof, which forms an nitrogen-containing layer on the contact surface of an isolation structure and epitaxial layers, thereby increasing the contact surface of the epitaxial layers and the isolation structure, so that increasing the total volume of the epitaxial layers and enabling silicide easier to be formed on the epitaxial layers.

The present invention provides a semiconductor structure including a substrate, at least two fin-shaped structures, at least an isolation structure and a plurality of epitaxial layers. These fin-shaped structures are located on the substrate. The isolation structure is located between these fin-shaped structures, and the isolation structure has a nitrogen-containing layer. These epitaxial layers respectively cover a part of these fin-shaped structures and are located on the nitrogen-containing layer.

The present invention provides a semiconductor process including the following steps. A substrate is provided. At least two fin-shaped structures are located on the substrate. An oxide layer is formed between these fin-shaped structures. A nitrogen-containing layer is formed in the oxide layer. An epitaxial process is performed to form a plurality of epitaxial layers covering a part of these fin-shaped structures.

The present invention provides a semiconductor structure and fabrication method thereof, which forms a nitrogen-containing layer between these epitaxial layers and the isolation structure such as an oxide layer, thereby an angle of the epitaxial layer relative to the oxide layer caused by the exclusion of the epitaxial layer and the isolation structure will not occur. Therefore, the semiconductor structure of the present invention can increase the contact surface of the epitaxial layers and the oxide layer, so that the total volume of the epitaxial layers can be increased. In this way, silicide formed on these epitaxial layers can be easier to attach on, and the surface area of the contact surface between the silicide and these epitaxial layers are therefore increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
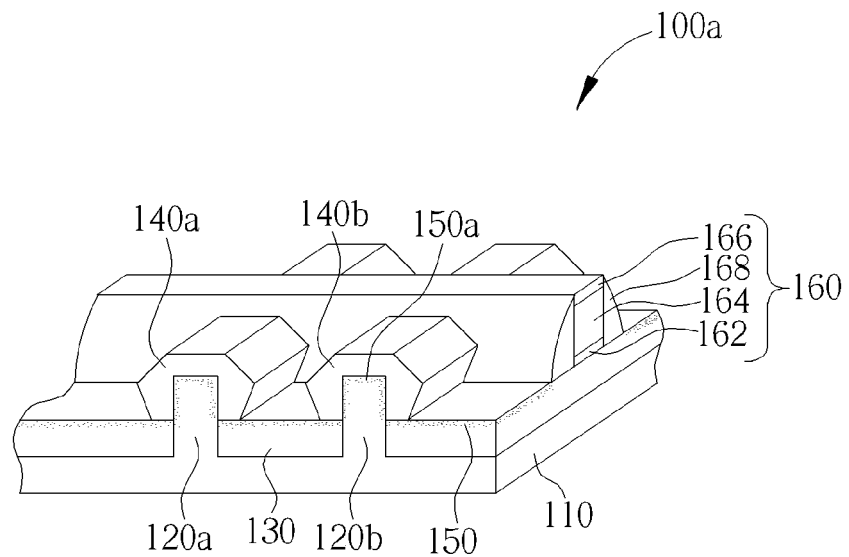
FIG. 1 schematically depicts a cross-sectional view of a semiconductor structure having a silicon substrate according to one preferred embodiment of the present invention.
Figure 2:
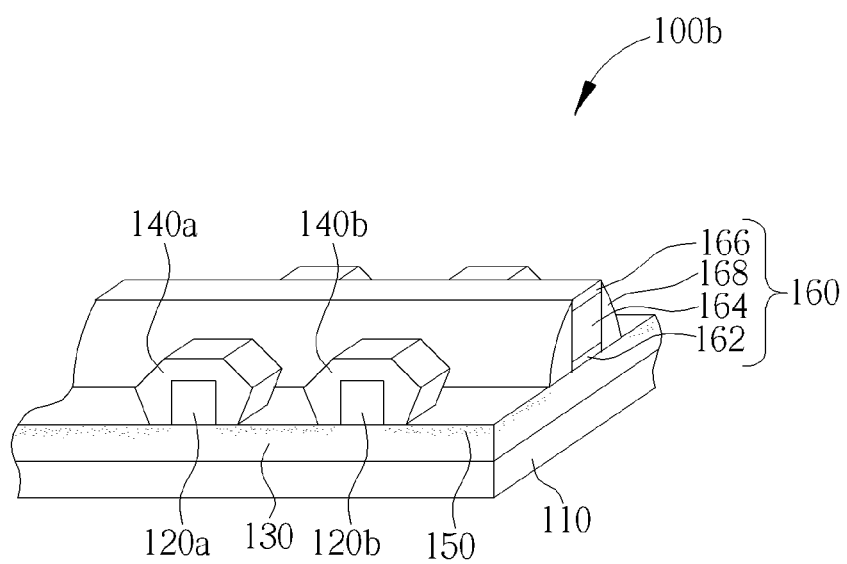
FIG. 2 schematically depicts a cross-sectional view of a semiconductor structure having a silicon-on-insulator substrate according to one preferred embodiment of the present invention.

FIG. 1 schematically depicts a cross-sectional view of a semiconductor structure having a silicon substrate according to one preferred embodiment of the present invention. FIG. 2 schematically depicts a cross-sectional view of a semiconductor structure having a silicon-on-insulator substrate according to one preferred embodiment of the present invention. Please refer to FIGS. 1-2. The semiconductor structures 100a and 100b all include a substrate 110, two fin-shaped structures 120a and 120b, an isolation structure 130 and two epitaxial layers 140a and 140b. The fin-shaped structures 120a and 120b are located on the substrate 110. The isolation structure 130 is located between the fin-shaped structures 120a and 120b. The isolation structure 130 has a nitrogen-containing layer 150. The epitaxial layers 140a and 140b respectively cover a part of the fin-shaped structures 120a and 120b, and are located on the nitrogen-containing layer 150. FIGS. 1-2 only show two fin-shaped structures 120a and 120b. However, there may be more than two fin-shaped structures in the semiconductor structures 100a and 100b, and the isolation structure 130 is located between each of these fin-shaped structures, such that a plurality of epitaxial layers respectively cover these fin-shaped structures. Furthermore, in the embodiments of FIG. 1 and FIG. 2, the semiconductor structure 100a or 100b may be a fin field-effect transistor or a tri-gate MOSFET. If the semiconductor structure 100a or 100b is a fin field-effect transistor, the sidewalls of the fin-shaped structure 120a or 120b can be gate channels of the semiconductor structure 100a or 100b, and the semiconductor structure 100a or 100b therefore has two gate channels. If the semiconductor structure 100a or 100b is a tri-gate MOSFET, the top surface and the sidewalls of the fin-shaped structure 120a or 120b can be gate channels of the semiconductor structure 100a or 100b, and the semiconductor structure 100a and 100b therefore has three gate channels.

The substrate 110 may be a silicon substrate or a silicon-on-insulator substrate, but it is not limited thereto. As shown in FIG. 1, the substrate 110 is a silicon substrate as an example. Two fin-shaped structures 120a and 120b extrude from the substrate 110, wherein the two fin-shaped structures 120a and 120b may be formed by covering a hard mask on the substrate 110 and performing a lithography process and an etching process. The isolation structure 130 is disposed between these fin-shaped structures 120a and 120b. The isolation structure 130 may be an oxide layer, which may be formed by shallow trench isolation technologies. In this embodiment, the isolation structure 130 includes a nitrogen-containing layer 150, which may be formed by nitriding the surface of the isolation structure 130 or by depositing a nitride layer on the isolation structure 130. Therefore the nitrogen-containing layer 150 may include a silicon nitride layer or a silicon oxynitride layer, depending upon requirements or processes. Otherwise, the nitrogen-containing layer 150a may further be located between the fin-shaped structures 120a and 120b and the epitaxial layers 140a and 140b, depending upon the nitridation processes. The epitaxial layers 140a and 140b respectively cover a part of the fin-shaped structures 120a and 120b and are located on the nitrogen-containing layer 150.

The nitrogen-containing layer 150 is disposed approximately at the contact surface of the epitaxial layers 140a and 140b and the isolation structure 130. By doing this, after the nitrogen atoms are doped, the mutual repulsion between the epitaxial layers 140a and 140b and the isolation structure 130 of the prior art will not occur, and the epitaxial layers 140a and 140b will conformally grow along the surface of the nitrogen-containing layer 150. Thus, the contact areas of the epitaxial layers 140a and 140b and the isolation structure 130 increase, and the total volume of the epitaxial layers 140a and 140b therefore increase, so that the surface area of silicide (not shown) covering the epitaxial layers 140a and 140b increases. Furthermore, because the epitaxial layers 140a and 140b and the isolation structure 130 can conformally contact with each other, metal layers such as titanium (Ti), cobalt (Co), nickel (Ni), etc. formed in later processes can more easily cover the surface of the epitaxial layers 140a and 140b and the isolation structure 130 entirely for performing self-aligning salicide processes.

In addition, the semiconductor structure 100a may further include a gate structure 160 covering the fin-shaped structures 120a and 120b between the epitaxial layers 140a and 140b. The gate structure 160 may include a gate dielectric layer 162, a gate electrode 164, a cap layer 166 and a spacer 168. The gate dielectric layer 162 covers the fin-shaped structures 120a and 120b. The gate electrode 164 covers the gate dielectric layer 162. The cap layer 166 covers the gate electrode 164. The spacer 168 is located beside the gate dielectric layer 162, the gate electrode 164 and the cap layer 166. In this structure, each of the epitaxial layers 140a and 140b paired with the corresponding epitaxial layers (not shown) on the other side of the gate structure 160 can be used as a source/drain region. Therefore, a Multi-gate MOSFET such as a Fin-FET or a Tri-gate MOSFET can be formed. Furthermore, other components may also be disposed on the semiconductor structure 100a. The gate electrode 164 may be a metal gate electrode or a poly-gate electrode. If the gate electrode 164 is a poly-gate electrode, it may be replaced by a metal gate electrode in following processes, wherein the following processes may be a gate last process or etc. The gate last process may include a gate last for high-k first process or a gate last for high-k last process. The processing steps are known in the art, and so are not described herein.

As shown in FIG. 2, the substrate 110 is a silicon-on-insulator substrate as an example, wherein the capability is similar with the embodiment of FIG. 1. However, the isolation structure 130 is formed as one layer on the substrate 110, such as an oxide layer, so that the fin-shaped structures 120a and 120b are formed on the isolation structure 130 rather than extruding from the substrate 110 as shown in FIG. 1. Due to the structure above the isolation structure 130 and the fin-shaped structures 120a and 120b of FIG. 2 being similar with the embodiment of FIG. 1, the structure of FIG. 2 is functionally similar to the structure of FIG. 1, so further description is omitted herein.

A semiconductor process is provided in the following for forming the aforementioned semiconductor structure. FIGS. 3-9 schematically depict a cross-sectional view of a semiconductor process according to one preferred embodiment of the present invention. FIG. 10 schematically depicts a cross-sectional view of a semiconductor process according to one preferred embodiment of the present invention.

Figure 3:
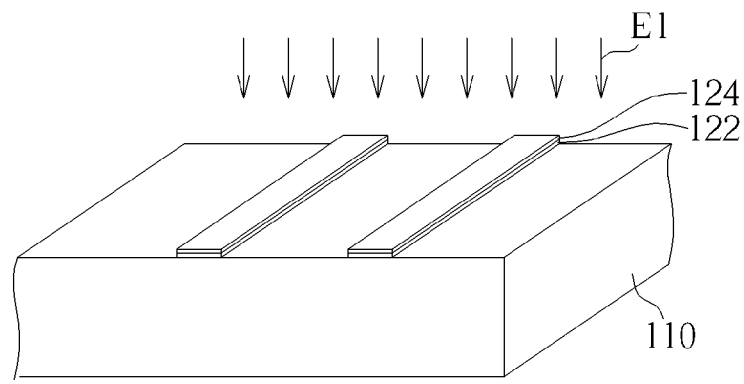
FIGS. 3-9 schematically depict a cross-sectional view of a semiconductor process according to one preferred embodiment of the present invention.
Figure 4:
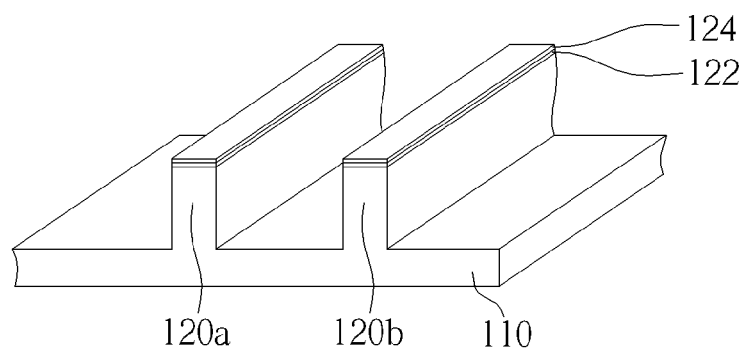
Figure 5:
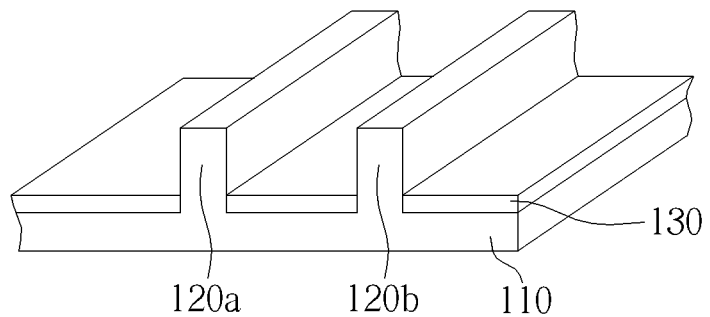

As shown in FIG. 3, a substrate 110 is provided, wherein the substrate 110 is a silicon substrate in this embodiment for example. A mask layer (not shown) is formed on the substrate 110, wherein the mask layer includes a pad oxide layer (not shown) and a nitride layer (not shown) located on the pad oxide layer. A photolithography process E1 is performed to pattern the mask layer for forming a patterned pad oxide layer 122 and a patterned nitride layer 124 and exposing a part of the substrate 110. As shown in FIG. 4, the patterns of the patterned pad oxide layer 122 and the patterned nitride layer 124 are transferred into the substrate 110 and two fin-shaped structures 120a and 120 are therefore formed As shown in FIG. 5, an isolation structure 130, such as an oxide layer, is formed between the fin-shaped structures 120a and 120b by performing processes such as a depositing process and an etching back process, wherein the isolation structure 130 may be formed by a shallow trench isolation structure. By doing this, two fin-shaped structures 120a and 120b are formed on the substrate 110, and an isolation structure 130 is formed between the fin-shaped structures 120a and 120b. In this embodiment, the patterned pad oxide layer 122 and the patterned nitride layer 124 are removed for forming a tri-gate MOSFET. In another embodiment, the patterned pad oxide layer 122 and the patterned nitride layer 124 may be remained for forming a fin field-effect transistor.

Figure 6A:
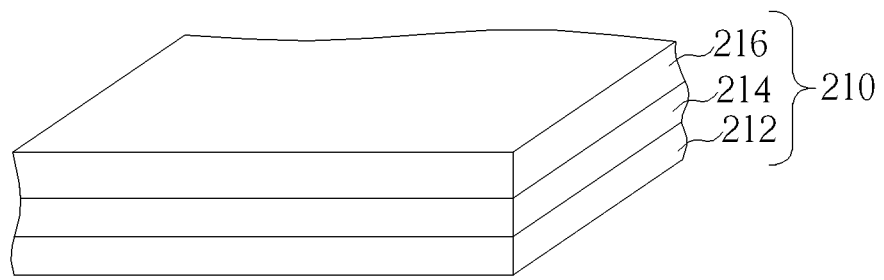
Figure 6B:
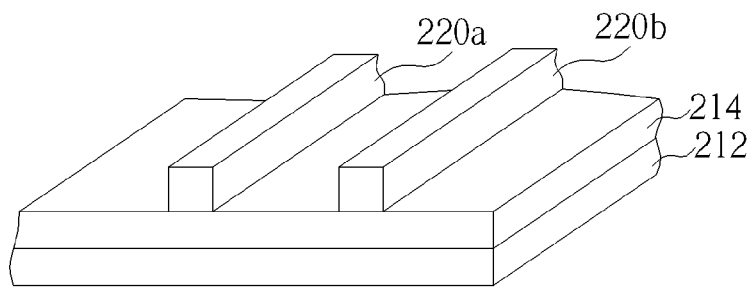

In addition, FIGS. 6A-6B depict another forming method of this embodiment. As shown in FIG. 6A, a silicon-on-insulator substrate 210 is provided, which includes a substrate 212, a bottom oxide layer 214 located on the substrate 212, and a silicon layer 216 located on the bottom oxide layer 214. As shown in FIG. 6B, the silicon layer 216 is patterned to form the fin-shaped structures 220a and 220b and expose a part of the bottom oxide layer 214 between the fin-shaped structures 220a and 220b. In this way, two fin-shaped structures 220a and 220b can also be formed on the substrate 212, and one isolation structure (the bottom oxide layer 214) can be formed between the fin-shaped structures 220a and 220b. The difference between FIG. 1 and FIG. 6B is: the isolation structure 130 formed on the silicon substrate is just located between the fin-shaped structures 120a and 120b (as shown in FIG. 1), but the bottom oxide layer 214 formed by the silicon-on-insulator substrate 210 is also located below the fin-shaped structures 220. However, the difference does not affect the later semiconductor processes of the present invention.

Figure 7:
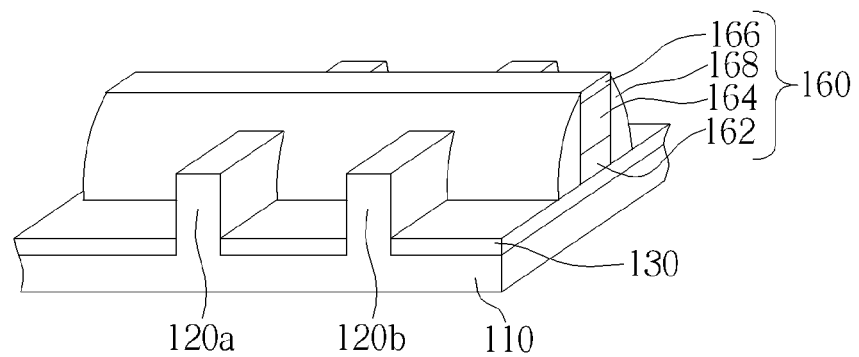

As shown in FIG. 7, a gate structure 160 is formed on a part of the isolation structure 130 and apart of the fin-shaped structures 120a and 120b. The forming process of the gate structure 160 may include sequential depositing and patterning to form a gate dielectric layer 162 on a part of the isolation structure 130 and a part of the fin-shaped structures 120a and 120b, a gate electrode 164 on the gate dielectric layer 162, a cap layer 166 on the gate electrode 164, and a spacer 168 beside the gate dielectric layer 162, the gate electrode 164, and the cap layer 166. The forming methods of these materials are known in the art, and are not described herein.

Figure 8:
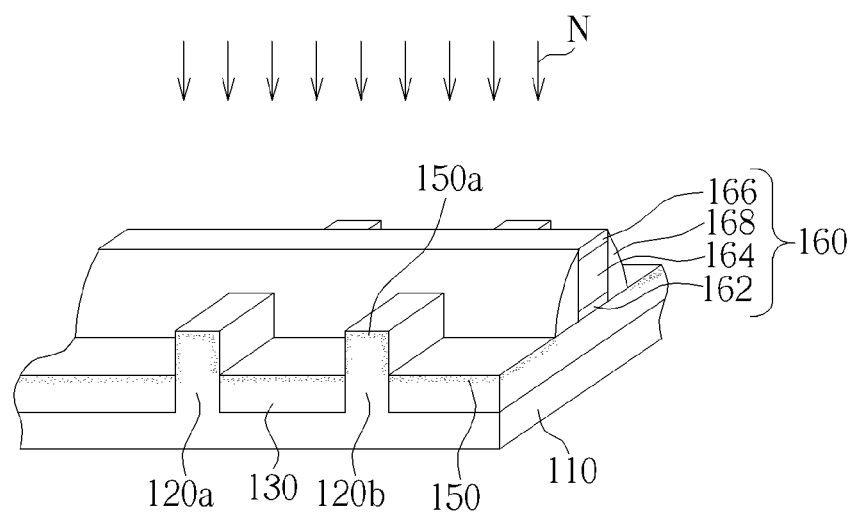

As shown in FIG. 8, a nitrogen-containing layer 150 is formed in the isolation structure 130. In this embodiment, a nitridation process N is performed to nitridate the isolation structure 130, so that the nitrogen-containing layer 150 is formed in the isolation structure 130. In another embodiment, a nitrogen-containing layer may be deposited on the isolation structure 130. In one case, the nitridation process N may include a decoupled plasma nitridation process, an ammonia-containing annealing process, a remote plasma nitridation process or a thermal nitridation process, but it is not limited thereto. In a preferred embodiment, after the nitridation process N performed, a post-nitridation annealing process may be performed, wherein the post-nitridation annealing process may include an ammonia-containing annealing process, etc. The materials of the nitrogen-containing layer 150 may include a silicon nitride layer or a silicon oxynitride layer, depending upon the forming methods of the nitrogen-containing layer 150. Otherwise, the nitridation process N can entirely or partly nitridate the isolation structure 130 and the fin-shaped structures 120a and 120b. If the isolation structure 130 and the fin-shaped structures 120a and 120b are nitridized by the nitridation process N, a nitrogen-containing layer 150a may further be located in the fin-shaped structures 120a and 120b.

Figure 9:
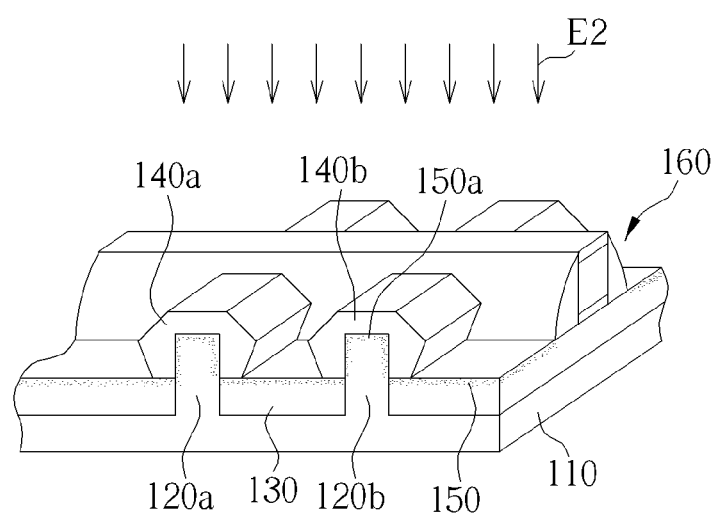
Figure 10:
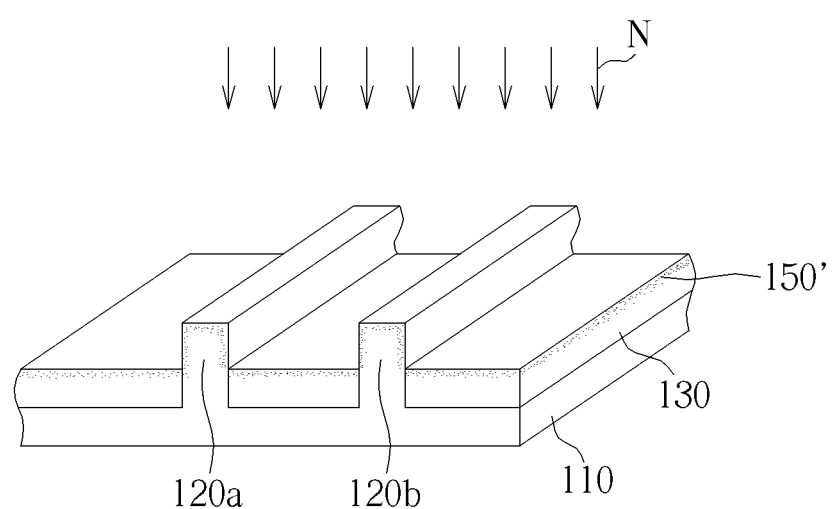
FIG. 10 schematically depicts a cross-sectional view of a semiconductor process according to one preferred embodiment of the present invention.

As shown in FIG. 9, an epitaxial process E2 is performed to form the epitaxial layers 140a and 140b beside the gate structure 160, covering a part of the fin-shaped structures 120a and 120b and located on the nitrogen-containing layer 150. That is, the epitaxial layers 140a and 140b are formed on the fin-shaped structures 120a and 120b without the gate structure 160 covering thereon. The epitaxial layers 140a and 140b may include silicon germanium epitaxial layers, or silicon carbide epitaxial layers, etc., according to the electrical properties of the Multi-gate MOSFET.

The nitrogen-containing layer 150 is disposed approximately at the contact surface of the epitaxial layers 140a and 140b and the isolation structure 130. By doing this, after the nitrogen atoms are doped, the mutual repulsion between the epitaxial layers 140a and 140b and the isolation structure 130 does not occur as it would in the prior art, and the contact areas of the epitaxial layers 140a and 140b and the isolation structure 130 increase. Then, the total volume of the epitaxial layers 140a and 140b increases, so that the surface area of silicide (not shown) covering the epitaxial layers 140a and 140b increases. Furthermore, due to the epitaxial layers 140a and 140b and the isolation structure 130 conformally contacting with each other, metal layers formed in later processes, such as titanium (Ti), cobalt (Co), nickel (Ni), etc. can more easily cover the surface of the epitaxial layers 140a and 140b and the isolation structure 130 entirely for performing self-aligning salicide processes.

Additionally, in this embodiment, a nitridation process N is performed to form a nitrogen-containing layer 150 after the gate structure 160 is formed. In another embodiment, a nitridation process N can be performed to form a nitrogen-containing layer 150' in the entirety of the isolation structure 130 and the fin-shaped structures 120a and 120b (as shown in FIG. 10), after the isolation structure 130 is formed (as shown in FIG. 5 or FIG. 6B). In other words, the nitrogen-containing layer 150' in the isolation structure 130 and the fin-shaped structures 120a and 120b can be formed before the gate structure 160 is formed.

The nitrogen-containing layer 150 can not only be formed by the nitridation process N, but can also be formed by processes such as a chemical vapor deposition (CVD) process, depositing one nitrogen-containing layer in the isolation structure 130 and the fin-shaped structures 120a and 120b. Furthermore, the nitrogen-containing layer 150' may be formed in the entirety of the isolation structure 130 and the fin-shaped structures 120a and 120b, or the nitrogen-containing layer 150' may be formed in a part of the isolation structure 130 and a part of the fin-shaped structures 120a and 120b.

Above all, the present invention provides a semiconductor structure and fabrication method thereof, which forms a nitrogen-containing layer between the epitaxial layers and the isolation structure, such as the oxide layer, thereby preventing an angle of the epitaxial layers relative to the oxide layer caused by repulsion of the epitaxial layer and the isolation structure. Therefore, the semiconductor structure of the present invention can increase the contact surface of the epitaxial layers and the isolation structure, so that the total volume of the epitaxial layers can be increased. In this way, silicide formed on the epitaxial layers attaches more easily, and the surface area of the contact surface between the silicide and the epitaxial layers is therefore increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-planar semiconductor structure, comprising:
   a substrate;
   at least two fin-shaped structures located on the substrate;
   at least an isolation structure located between the fin-shaped structures, the isolation structure and the fin-shaped structures having a nitrogen-containing layer; and
   a plurality of epitaxial layers respectively covering a part of the fin-shaped structures and located on the nitrogen-containing layer.

2. The non-planar semiconductor structure according to claim 1, wherein the substrate comprises a silicon substrate or a silicon-on-insulator substrate.

3. The non-planar semiconductor structure according to claim 1, further comprising a gate structure covering the fin-shaped structures between the epitaxial layers.

4. The non-planar semiconductor structure according to claim 3, wherein the gate structure further comprises:
   a gate dielectric layer covering the fin-shaped structures;
   a gate electrode covering the gate dielectric layer;
   a cap layer covering the gate electrode; and a spacer located beside the gate dielectric layer, the gate electrode and the cap layer.

5. The non-planar semiconductor structure according to claim 1, wherein the nitride layer comprises a silicon nitride layer or a silicon oxynitride layer.

6. The non-planar semiconductor structure according to claim 1, wherein the nitrogen-containing layer is also located between the fin-shaped structures and the epitaxial layers.

\* \* \* \* \*